US006887760B2

(12) United States Patent
Curro'et al.

(10) Patent No.: US 6,887,760 B2
(45) Date of Patent: May 3, 2005

(54) FABRICATION PROCESS OF A TRENCH GATE POWER MOS TRANSISTOR WITH SCALED CHANNEL

(75) Inventors: Giuseppe Curro', Messina (IT); Barbara Fazio, Messina (IT)

(73) Assignee: STMicroelectronics S.r.l., Agrate Brianza (IT)

(*) Notice: Subject to any disclaimer, the term of this patent is extended or adjusted under 35 U.S.C. 154(b) by 168 days.

(21) Appl. No.: 10/351,281

(22) Filed: Jan. 24, 2003

(65) Prior Publication Data

US 2003/0181011 A1 Sep. 25, 2003

(30) Foreign Application Priority Data

Jan. 25, 2002 (IT) .................................... VA2002A0005

(51) Int. Cl.[7] ...................... H01L 21/336; H01L 29/768

(52) U.S. Cl. ...................... 438/268; 438/589; 438/751; 438/757; 438/723; 438/138; 257/238; 257/302; 257/331; 257/329; 257/341

(58) Field of Search ................................ 438/268, 589, 438/751–757, 723, 138; 257/238, 341, 302, 333, 331, 329

(56) References Cited

U.S. PATENT DOCUMENTS 4,997,783 A * 3/1991 Hsu .......................... 438/209
5,032,888 A * 7/1991 Seki .......................... 257/212
6,319,777 B1 * 11/2001 Hueting et al. ............. 438/270
6,423,618 B1 * 7/2002 Lin et al. .................... 438/589
2001/0001494 A1 * 5/2001 Kocon ........................ 257/328

* cited by examiner

*Primary Examiner*—Matthew Smith
*Assistant Examiner*—Igwe U. Anya
(74) *Attorney, Agent, or Firm*—Lisa K. Jorgenson; Allen, Dyer, Doppelt, Milbrath & Gilchrist, P.A.

(57) ABSTRACT

A process for forming a trench gate power MOS transistor includes forming an epitaxial layer having a first type of conductivity on a semiconductor substrate, and forming a body region having a second type of conductivity on the epitaxial layer. A gate trench is formed in the body region and in the epitaxial layer. The process further includes countersinking upper portions of the gate trench, and forming a gate dielectric layer on surfaces of the gate trench including the upper portions thereof. A gate conducting layer is formed on surfaces of the gate dielectric layer for defining a gate electrode. The gate conducting layer has a thickness that is insufficient for completely filling the gate trench so that a residual cavity remains therein. The residual cavity is filled with a filler layer. The gate conducting layer is removed from an upper surface of the body region while using the filler layer as a self-aligned mask. The edge surfaces of the gate conducting layer are oxidized. Source regions are formed by implanting dopants in the body region while using the oxidized edge surfaces as a self-aligned mask, and the implanted dopants are diffused in the body region.

32 Claims, 2 Drawing Sheets

Thermal SiO2
n+ source

FABRICATION PROCESS OF A TRENCH GATE POWER MOS TRANSISTOR WITH SCALED CHANNEL

FIELD OF THE INVENTION

The present invention relates to fabrication techniques for integrated devices, and in particular, to a fabrication technique for a trench gate power MOS transistor.

BACKGROUND OF THE INVENTION

Designing and fabricating power VDMOS transistors having scaled dimensions but with high current capabilities is limited with respect to nested geometries being formed within an elementary unit in an active area. Moreover, even if it were possible to accurately align structures in submicron spaces, certain contributions to the ON-resistance of the integrated device would still limit the level of performance that can be achieved.

A typical example is the JFET contribution to the resistance in the active area, which depends on the separation distance between contiguous body diffusions. Making two contiguous elementary structures closer together leads to an increase in the packing density, and thus the active perimeter of the device per unit area. At the same time it causes a net increase in the JFET resistance that opposes the current flow from the channel (source) to the drain of the device.

The use of trench structures for forming power MOS devices is well known. In particular, the article "An Ultra-Low On-Resistance Power MOSFET Fabricated Using A Fully Self-Aligned Process", by D. Ueda et al., IEEE Trans. Elect. Dev. ED-34 (1987), p. 926, discloses the structure and the fabrication process of a totally self-aligned device with the gate trench completely filled with polysilicon (deposited poly-crystalline silicon). This structure needs a photolithographic masking step for defining the source diffusion over the body. The isolation between the gate and the source is formed through selective thermal oxidization of the gate polysilicon, and it is thus self-aligned to the gate structure. It must be observed that the gate geometry in the active area imposes stringent limits to the thickness of the isolation oxide to be grown on the polysilicon.

A totally self-aligned structure with the body/source short formed along the whole perimeter by way of a trench is described in U.S. Pat. No. 5,283,201. In this case, the isolation between the gate and the source electrode is obtained by the formation of an initial spacer. This is a complicated process, and introduces a limitation in the scaling down of lateral dimensions (and to the packing) as a consequence of using an initial spacer.

SUMMARY OF THE INVENTION

In view of the foregoing background, an object of the present invention is to form a power MOS device with a trench in the active area but with geometries of the polysilicon gate, body, source and contacts being self-aligned to the trench so that a low cost submicron elementary MOS structure is formed without requiring the formation of any initial spacer. This minimizes limitations resulting from the reduction of lateral dimensions when using an initial spacer. The advantages typically associated with an active trench structure include the elimination of the JFET contribution to the ON-resistance, and the reduction of accumulations and epitaxy contributions thereto.

According to the invention, a MOS transistor with a trench gate is formed with a process that allows self-alignment of the polysilicon gate structure to the trench itself, and the successive self-alignment of the body and source implantations to the polysilicon window itself. In this way, the critical steps associated with carrying out the photolithographic masking steps for defining submicron features, such as the polysilicon gate and body implantations, are avoided.

According to a preferred embodiment, the body/source short-circuiting contacts in the active area may be formed in a self-aligned mode by partially oxidizing the patterned doped polysilicon gate layer. The thickness of the grown oxide layer, which may at most reach a thickness of a few hundreds of nanometers, also serves the purpose of defining the source implantation window, and thus the residual limitation to the reduction of lateral dimensions is of this order of magnitude. The thickness is equal to the thickness of the thermal oxide grown on the definition edge of the polysilicon gate.

According to yet a further embodiment, the body/source short-circuiting contact in the active area may be realized using a further submicron trench in the diffused silicon, with a depth greater than the depth of the source diffusion. In this way, it is possible to eliminate the photolithographic masking step for defining the source.

The present invention allows the formation of a trench gate power MOS device with a large channel perimeter, and with a channel width smaller than one micrometer while ensuring the absence of negative effects due to the so-called short channel phenomenon. According to a first embodiment, the process of the invention requires a single photolithographic masking step for defining the structure within the active area by exploiting the self-alignment of the polysilicon gate strip to the trench itself.

According to a second and preferred embodiment, even the photolithography that would normally be required for defining the source implant in the active area is eliminated. This is done by the fact that formation of the body/source short-circuiting contact in the active area is realized through the formation of a second trench self-aligned to the gate trench. This will be described in more detail below.

The lateral isolation between the gate and the source in the active area is realized in a self-aligned mode through the controlled growth of silicon oxide on the lateral walls of the edge of the polysilicon gate using a so-called LOCOS™ (trademark of Philips N.V.) process or another similar process.

The upper isolation is provided, on the contrary, by the gate trench filling procedure, and this represents a crucial aspect of the process of the invention. Basically, the gate trench is coated by a film of doped polysilicon deposited under conditions that favor deposition in a highly conformal way. The thickness of the deposited polysilicon film leaves a certain trench cavity.

The residual cavity that remains after the deposition of a conformal polysilicon film is filled with a planarizing material, such as silicon oxide, for example. The silicon dioxide is deposited with a high pressure chemical vapor deposition process (HPD). Thereafter, planarization of the surface is commonly carried out by a chemical mechanical polishing (CMP) technique.

The filling oxide forms the hard mask for defining the self-aligned polysilicon gate during the anisotropic (vertical) etching of the polysilicon. An evident advantage of the structure realized with the method of the invention results in a net reduction in the defects of the fabrication process because of the elimination of relatively critical masking steps. The reduction of fabrication costs that are achieved is also evident.

Crucial steps in the process of the invention are the lateral definition of the gate electrode self-aligned to the trench in the active area, and the successive oxidation of the vertical walls of the edges of the polysilicon gate layer for ensuring gate insulation from the source region.

According to the preferred embodiment, other important steps are the realization of the body/source short-circuiting contact. This may be done by forming a second trench self-aligned to the gate electrode laterally insulated by the layer of oxide grown over the walls of the definition edges of the polysilicon. That is, the second trench is self-aligned to the lateral gate insulating oxide layer.

According to a further embodiment, a deposition on or growth of a silicide layer at the surface of the deposited layer of polysilicon may be carried out for forming a stack having less electrical resistivity than that of the polysilicon layer having the same thickness. This is done to reduce the resistance of the gate electrode patterned from such a stack. This may be useful or necessary because the relatively small thickness of the polysilicon layer deposited in the trench may represent an intrinsic limit to the conductivity of the patterned gate electrode, and as a consequence, to the switching speed of the device. Appropriately enhanced layout approaches (distribution of the gates in the active area) may be implemented for reducing the gate electrode resistance without necessarily coupling a metal silicide film onto the deposited polysilicon layer.

BRIEF DESCRIPTION OF THE DRAWINGS

FIGS. from 1 to 5 illustrate the steps for forming a gate trench MOS transistor according to the present invention.

DETAILED DESCRIPTION OF THE PREFERRED EMBODIMENTS

FIGS. 1 to 5 depict the main aspects of the process of the invention, according to a preferred embodiment. The steps that are carried out are described below in a form that, even if concise for not overburdening the description, are clear and sufficient to one skilled in modern fabrication techniques for integrated devices.

The invention is useful and effective in a first embodiment when the device is fabricated following a process that forms the body region of the integrated MOS transistor structure in a second epitaxially grown layer of a certain type of conductivity, formed over the surface of a first epitaxial layer of an opposite type of conductivity. The invention is also useful and effective in a second embodiment for a more traditional process that forms the body region as an implanted and diffused region produced in a single epitaxial layer formed on a monocrystalline substrate.

The main process steps for the fabrication process according to a preferred embodiment of the present invention, for the two above indicated cases, are described below.

First Embodiment (Epitaxial Body):

A double epitaxial layer is formed: substrate (n+)/epi-Si (n)/epi-Si (p) (body). The edge structure and the active area are defined according to any one of the prior art techniques. The second epitaxial layer will have the desired type of conductivity for the body region of the transistor, opposite to the type of conductivity of the first epitaxial layer.

A pad oxide or a pad oxide-nitride is grown and a layer of pyrolytic nitride (SiN/ox) is deposited over the surface of the second epitaxial layer, for example, a p-epitaxy. This is preferably carried out by a heat treatment in an oven in presence of oxygen for obtaining an oxide layer (≈10 to 20 nm), and eventually in the presence of nitrogen for obtaining an oxy-nitride layer. This is followed by deposition of a pyrolytic layer $Si_3N_4$ (30 to 70 nm) in an oven.

Figure 1:
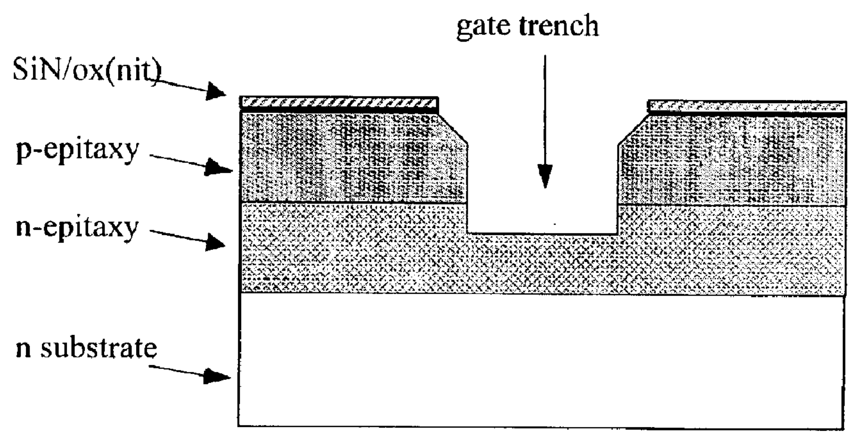

Gate trench photolithography is performed for forming a definition mask for the trench windows (strips) within the active area. The stack SiN/oxide/epi-Si is plasma etched to a depth exceeding the thickness of the second epitaxial layer (p-epitaxy) to reach down into the first epitaxial layer (n-epitaxy). At this point of the process a structure as depicted in FIG. 1 is obtained.

The process further includes countersinking the upper portion of the trenches. This is a first aspect of the process of the invention. Any technique appropriate to produce a desired countersinking may be used. Several techniques that may be satisfactorily used are as follows.

Plasma etching of the stack SiN/oxide/mono-Si may be used to form the countersink. The tilt angle is controlled in order to etch the upper portion of the trench walls to obtain a countersinking of about 50 to 100 nm at the rim of the trench. The steps of tilting the wafer to produce the desired countersinking of the upper portion of the trench may be throughout, or upon terminating the vertical etching of the trench down to the desired depth.

Wet selective etching of the silicon epitaxy in KOH and successive removing of the pyrolytic nitride by wet etching may also be used to form the countersink. The underlying pad oxide or oxide-nitride is not etched and remains in place.

Repeated cycles of thermal oxidation followed by wet etching of the oxide for rounding the profile of the upper (rim) portion of the trench (bird's beak under the edge of the deposited layer of the pyrolytic nitride) and successive wet etching of the pyrolytic nitride (the underlying pad oxide or oxy-nitride is not etched and remains in place) may also be used to form the countersink.

The gate dielectric is grown next. This is commonly performed by a thermal oxidation treatment or by an oxy-nitriding treatment or other equivalent techniques. The gate dielectric has a thickness generally between about 5 nm and 100 nm. A doped polysilicon gate layer (gate poly-Si) having a thickness compatible with a width of the trench for the above mentioned reasons is deposited. The thickness is generally equal or smaller than about ⅓ of the trench width.

Figure 2:
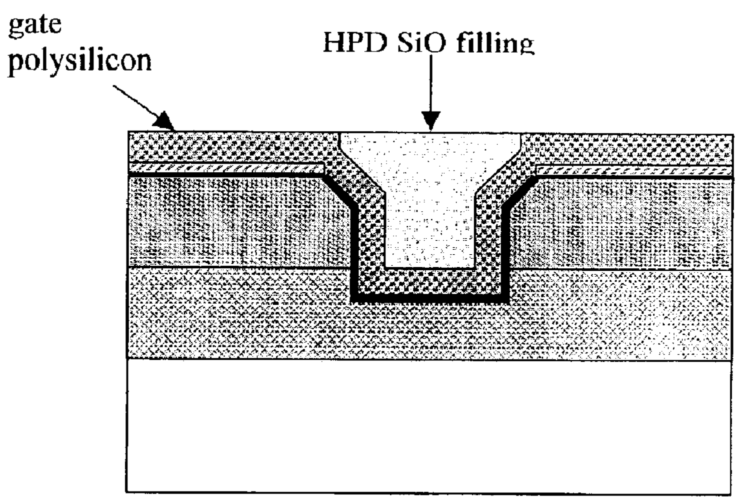

A HPD oxide filler layer is deposited. This layer generally has a thickness that is at least twice the depth of the residual trench cavity. The surface is then planarized. A CMP etching technique of the deposited layer of filler oxide may be performed, for example. This establishes the end-point on the polysilicon. At this point of the process a structure as depicted in FIG. 2 is obtained.

Figure 3:
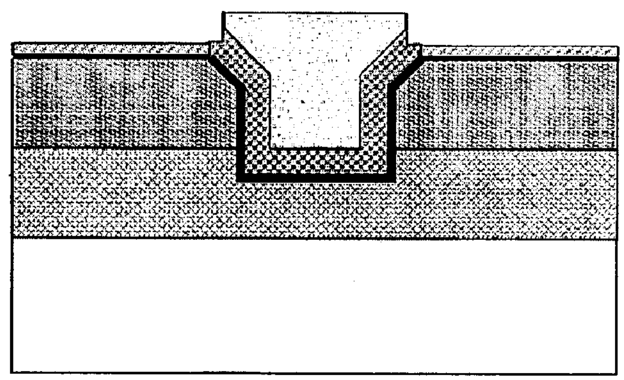

For patterning the polysilicon gate, plasma etching is carried out under highly anisotropic conditions. This establishes the end-point on the pyrolytic silicon nitride, or in the case of a previous etching of the nitride, on the silicon oxide, while exploiting as a hard mask the HPD oxide plug that fills the residual trench cavity. At this point of the process a structure as depicted in FIG. 3 is obtained.

The rim portion of the defined gate is oxidized by a heat polysilicon treatment in an oven. This is for growing an oxide layer along the exposed edges of the polysilicon gate electrode structure for a thickness (or depth) generally between about 200 nm and about 400 nm. In case the pyrolytic nitride layer has not yet been removed, this is done by anisotropic (vertical) etching of the pyrolytic silicon nitride layer. This establishes the end-point of the underlying pad oxide or oxy-nidride layer.

The source dopant is implanted with a kinetic energy that is a function of the designed channel length and of the thickness of the oxide or oxy-nitride pad layer. Diffusion of the source dopant by rapid thermal treatment (eventually carried out in an oxidizing atmosphere, if required) is performed.

Figure 4:
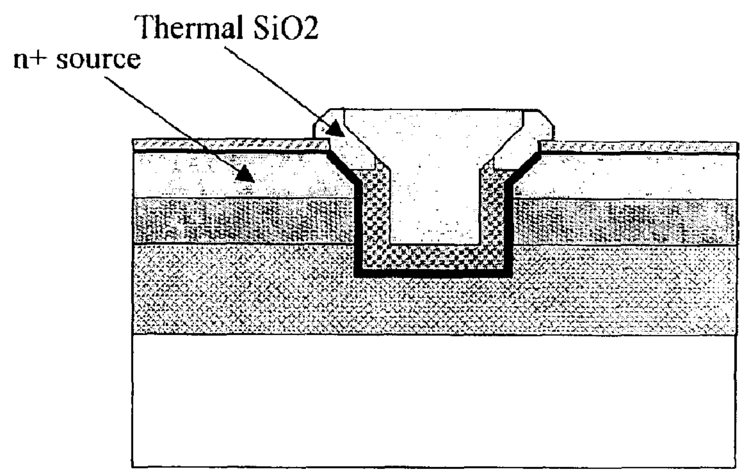

Contact trench etching by anisotropic (vertical) etching of the pad oxide or oxy-nitride layer and of the silicon is performed for a depth into the upper epitaxial layer (body region of the device) that exceeds the depth of the polysilicon profile of the source junction ($x_j$). At this point of the process a structure as depicted in FIG. 4 is obtained.

Figure 5:
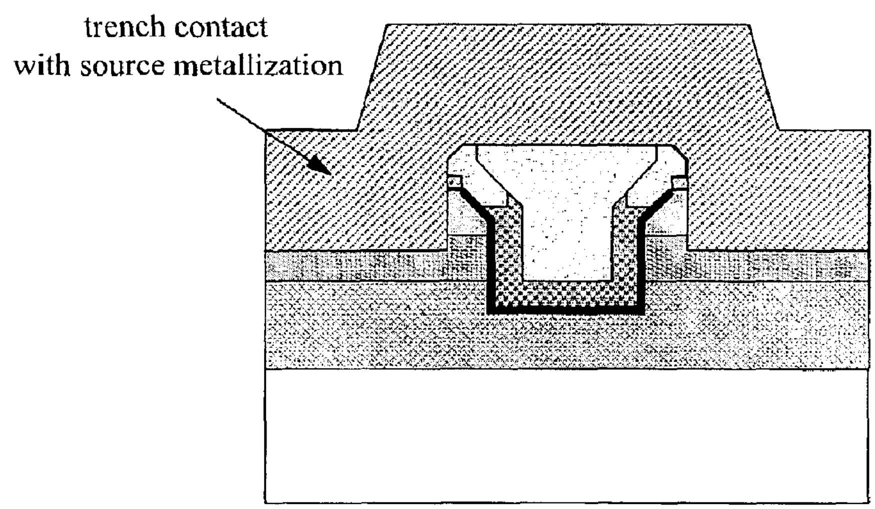

The other steps include depositing the metal for the edge and an alloying treatment followed by the finishing and metallization of the rear side of the wafer. These steps are performed according to commonly used techniques. At this point of the process a structure as depicted in FIG. 5 is obtained.

An example of the sequence of steps for forming the active area according to the above described embodiment of the invention may be as follows. On a monocrystalline silicon substrate with a high N-type dopant concentration, an N-type first epitaxial layer is grown with a bulk resistivity chosen as a function of the voltage class of the device. A second, P-type, epitaxial layer is then grown over the first epitaxial layer forming the body region of the device. The thickness of this second or upper epitaxial layer is established as a function of the designed channel length.

Thereafter, a thin film of pad oxide (about 10 nm) is grown, onto which a film of pyrolytic SiN with a thickness generally of a few tens of nm is deposited. Instead of growing a thin pad layer of silicon oxide, a thin pad layer of oxy-nitride may be grown in an oven, or a previously grown oxide layer may be partially converted at the surface to oxy-nitride by heat treatment in an atmosphere of reactive nitrogen.

In the successive step, trenches are cut into the epitaxial silicon by masking and etching for a depth sufficiently deep to reach well into the first epitaxial layer. The width of the trenches is defined to contain both the gate polysilicon layer deposited in a conformal mode and an oxide filling layer deposited at high pressure (HPD). This is necessary for the self-aligned definition of the same gate pad, as it will be described below.

The upper portion of trench walls may be beveled while cutting them down into the epitaxial silicon or after having reached the desired depth. The bevelling or countersinking may be done either during the dry etching of the trench cutting by regulating appropriately the tilt angle or a dedicated end phase of the etching by any known technique. For example, countersinking of the upper portion of the trenches may be carried out by controlled wet etching in a solution of KOH, or by a thermally grown oxide over exposed areas followed by wet etching of the formed oxide. These steps are repeated several times until the desired degree of bevelling is obtained. Depending on the technique used, it may be necessary to preliminarily remove the film of deposited pyrolytic silicon nitride. The end result of these steps on the cross section of the gate trench is depicted in FIG. 1.

Successively, a doped polysilicon film (gate polysilicon) with a thickness smaller than or equal to about ⅓ of the width of the bottom portion of the gate trench is deposited under conditions of highly conformal deposition over step-like features. Then the residual cavities of the trenches are filled with a silicon oxide filler deposited with a high pressure (HPD) chemical vapor deposition process. The surface is planarized, for example, by a CMP technique, for uncovering the surface of the polysilicon film (as depicted in FIG. 2). The successive and crucial step of the process of the invention is the unidirectional etching (anisotropic) of the polysilicon, self-aligned to the trenches, through the hard mask formed by the plugs of the HPD filler oxide (as depicted in FIG. 3).

The end-point of this etching is on the pyrolytic silicon nitride layer or on the pad oxide or oxy-nitride film if the pyrolytic $Si_3N_4$ layer has already been removed. Thereafter, the source dopant (N-type) is implanted through the pad oxide and/or oxy-nidride layer. This implantation is self-aligned to the gate geometry and does not require a masking step. The energy of implantation must be sufficient for the accelerated ions to pass through the pyrolytic nitride layer and pad layer(s) or through the pad layer(s) of oxide or of oxy-nitride.

The successive step includes diffusion of this implanted dopant of the source region, and oxidation of the exposed edges for definition of the gate polysilicon. The latter serves to provide insulation between the gate electrode and the source metal layer that will be successively deposited (as depicted in FIG. 4).

The surface of the silicon over the diffusions is prevented from oxidizing because of the presence of the pyrolytic silicon nitride layer, or because it is sufficiently nitridized at the interface with the pad oxide layer. The successive and final steps of definition of the MOS structure within the active area may optionally comprise the formation of second trenches adjacent the gate trenches for short-circuiting the source and body diffusions, according to a preferred embodiment.

Self-alignment of these second trenches is ensured by the hard mask formed by HPD oxide plugs and by the oxide thermally grown on the definition edges of the gate polysilicon. The depth of these second trenches must be greater than that of the profile of the respective N+ source diffusions, but smaller than the depth of the interface between the P-type second epitaxial layer that forms the body of the MOS structure with the first epitaxial layer formed on the monocrystalline substrate.

Final steps of the process of the invention include the deposition of a source metal layer. For example, the metal layer includes an aluminum alloy with or without a metal barrier layer being formed at the interface. The result is depicted in FIG. 5.

The invention is equally effective even in the case of a process that contemplates the formation by implantation of respective dopants and diffusion in a silicon monocrystalline substrate of both the body region and source regions. In this case the process may be as follows.

Second Embodiment (Diffused Body):

An epitaxial layer of a first type of conductivity is formed on a semiconductor silicon mono-crystalline substrate, and the edge structure and the active area are formed according to any technique of the prior art. Photolithography of the gate trenches includes forming a definition mask for the trench strips within the active area, and the silicon is plasma etched.

The next step includes countersinking the upper part of the trenches. This represents an essential requirement of the process of the invention and any technique suitable to produce the desired countersinking may be used. For example, plasma etching the silicon crystal may be done while controlling the tilt angle to obtain a countersinking of about 50÷100 nm at the rim of the cross section profile of the trench. An appropriate tilt for inclining (beveling) the upper portion of the walls of the trench may be carried out during or at the end of the etching process.

Growth of the gate dielectric is commonly performed by a thermal oxidation treatment or by a oxy-nitriding treatment or equivalent techniques for a thickness generally between about 5 nm and about 100 nm. A doped polysilicon gate layer (gate poly-Si) having a thickness compatible with a width of the trench for the above mentioned reasons is deposited. The thickness is generally equal or smaller than about ⅓ of the trench width.

A HPD oxide filler layer is deposited. This layer generally has a thickness of at least twice the depth of the residual trench-cavity. The next step includes planarizing the surface, for example, by a CMP etching technique of the deposited layer of filler oxide, for establishing the end-point on the polysilicon.

Plasma etching is performed for patterning the polysilicon gate. This establishes the end-point on the silicon oxide (or more generally on the gate dielectric). The rim portion of the defined gate is oxidized by a heat polysilicon treatment in an oven for growing the oxide layer along the exposed edges of the polysilicon gate electrode structure for a thickness (or depth) generally between about 200 nm and about 400 nm.

The body dopant is implanted with a kinetic energy that is a function of the designed channel length. The implanted body dopant is diffused by a heat treatment (eventually carried out in an oxidizing environment, if required).

The source dopant is implanted with a kinetic energy that is a function of the designed channel length. The implanted source dopant is diffused by a rapid heat treatment (eventually carried out in an oxidizing environment, if required).

An optional etching of the second trenches may be performed for establishing a body/source short-circuiting contact within the active area by anisotropic etching of the oxide and of the silicon to form a self-aligned trench to a depth into the body region of the device exceeding the depth of the bottom profile of the body/source junction ($x_j$). The source metal layer and alloying treatment is deposited. This is followed by finishing and metallization of the rear side of the wafer according to common techniques.

Variation with a Metallic Silicide on Poly-Si:

Optionally, in order to reduce the gate resistance, in both the above specified embodiments it is possible to add a conducting film of a silicide (for example, cobalt silicide, tungsten silicide, titanium silicide or equivalent conducting material), by simply depositing or growing a silicide layer on the surface of the gate polysilicon layer, that is, after the deposition of a doped polysilicon (gate poly-Si).

Accordingly, throughout this text, the gate electrode should be considered as not always as including a patterned single doped polysilicon layer, but as a patterned stack of a doped polysilicon bottom layer and of a silicide top layer. Of course in the latter case, the etching steps for defining the conductive stack and others that involve directly or indirectly these materials (gate patterning, end point of the HPD planarization of the oxide) will be adopted to the materials that compose the conductive stack.

The preferred embodiments for the two described alternative processes contemplate also the optional realization of second source/body short-circuiting trenches self-aligned to the gate trenches. As stated above, a short-circuit between the body and the source in an active area may alternatively be established by contacts defined by common masking techniques.

That which is claimed is:

1. A process for forming a trench gate power MOS transistor comprising:

forming an epitaxial layer having a first type of conductivity on a semiconductor substrate;

forming a body region having a second type of conductivity on the epitaxial layer;

defining an edge structure and an active area of the transistor in the body region and in the epitaxial layer;

forming a gate trench in the active area so that the body region is adjacent opposite sides of the gate trench;

countersinking upper portions of the gate trench;

forming a gate dielectric layer on surfaces of the gate trench including the upper portions thereof;

forming a gate conducting layer on surfaces of the gate dielectric layer for defining a gate electrode, the gate conducting layer having a thickness that is insufficient for completely filling the gate trench so that a residual cavity remains therein;

filling the residual cavity of the gate trench with a filler layer, the filler layer having a thickness that is at least double a depth of the residual cavity;

planarizing the filler layer and the gate conducting layer;

removing the gate conducting layer on an upper surface of the body region while using the filler layer as a self-aligned mask;

oxidizing edge surfaces of the gate conducting layer; and forming source regions by implanting dopants in the body region while using the oxidized edge surfaces as a self-aligned mask, and diffusing the implanted dopants in the body region, the body and source regions having an electrical short-circuit therebetween.

2. A process according to claim 1, wherein forming the gate conducting layer comprises conformally depositing a gate conducting material on the surfaces of the gate dielectric layer.

3. A process according to claim 1, wherein removing the gate conducting layer is performed by an anisotropic plasma etching.

4. A process according to claim 1, wherein forming the body region comprises forming a second epitaxial layer on the epitaxial layer.

5. A process according to claim 4, wherein forming the source regions comprises implanting the dopants into the second epitaxial layer; and diffusing the implanted dopants in the second epitaxial layer.

6. A process according to claim 1, wherein forming the body region comprises:

implanting dopants into the epitaxial layer while using the oxidized edge surfaces of the gate conducting layer as a self aligned mask; and diffusing the implanted dopants in the epitaxial layer.

7. A process according to claim 6, wherein implanting the dopants into the epitaxial layer is performed at an energy that is a function of a channel length of the transistor and of a temperature associated with diffusing the implanted dopants therein.

8. A process according to claim 1, further comprising:

forming second trenches in the active area adjacent the gate trench, the second trenches having a depth greater than a depth of the source regions; and filling the second trenches with a conducting material for providing the electrical, short-circuit between the body and source regions.

9. A process according to claim 8, wherein the second trenches are formed by anisotropic plasma etching while using the filler layer and the oxidized edge surfaces of the gate conducting layer as a self-aligned mask.

10. A process according to claim 1, further comprising forming a silicide layer over the gate conducting layer for increasing conductivity of the gate electrode.

11. A process according to claim 10, wherein the silicide comprises at least one of cobalt suicide, tungsten silicide and titanium suicide.

12. A process according to claim 1, wherein the countersink at the upper portions of the gate trench is within a range of about 50 to 100 nm.

13. A process according to claim 1, wherein the gate dielectric layer has a thickness within a range of about 5 to 100 nm.

14. A process for forming a trench gate power MOS transistor comprising:

forming a first epitaxial layer having a first type of conductivity on a semiconductor substrate;

forming a second epitaxial layer on the first epitaxial layer, the second epitaxial layer having a second type of conductivity and defining a body region of the transistor;

forming a gate trench extending into the first and second epitaxial layers;

countersinking upper portions of the gate trench;

forming a gate dielectric layer on surfaces of the gate trench including the upper portions thereof;

forming a gate conducting layer on surfaces of the gate dielectric layer for defining a gate electrode, the gate conducting layer having a thickness that is insufficient for completely filling the gate trench so that a residual cavity remains therein;

filling the residual cavity of the gate trench with a filler layer;

removing the gate conducting layer on an upper surface of the second epitaxial layer while using the filler layer as a self-aligned mask;

oxidizing edge surfaces of the gate conducting layer; and forming source regions by implanting dopants in the second epitaxial layer body while using the oxidized edge surfaces as a self-aligned mask, and diffusing the implanted dopants in the second epitaxial layer, the body and source regions having an electrical short-circuit therebetween.

15. A process according to claim 14, further comprising:

forming second trenches in the second epitaxial layer adjacent the gate trench, the second trenches having a depth greater than a depth of the source regions; and filling the second trenches with a conducting material for providing the electrical short-circuit between the body and source regions.

16. A process according to claim 15, wherein the second trenches are formed by anisotropic plasma etching while using the filler layer and the oxidized edge surfaces of the gate conducting layer as a self-aligned mask.

17. A process according to claim 14, further comprising forming a silicide layer over the gate conducting layer for increasing conductivity of the gate electrode.

18. A process according to claim 14, wherein the countersink at the uppers portions of the gate trench is within a range of about 50 to 100 nm.

19. A process according to claim 14, wherein the gate dielectric layer has a thickness within a range of about 5 to 100 nm.

20. A process for forming a trench gate power MOS transistor, the processing comprising:

forming an epitaxial layer having a first type of conductivity on a semiconductor substrate;

forming a gate trench in the epitaxial layer;

countersinking upper portions of the gate trench;

forming a gate dielectric layer on surfaces of the gate trench including the upper portions thereof;

forming a gate conducting layer on surfaces of the gate dielectric layer for defining a gate electrode, the gate conducting layer having a thickness that is insufficient for completely filling the gate trench so that a residual cavity remains therein;

filling the residual cavity of the gate trench with a filler layer;

removing the gate conducting layer on an upper surface of the epitaxial layer while using the filler layer as a self-aligned mask;

oxidizing edge surfaces of the gate conducting layer;

forming a body region in the epitaxial layer by implanting dopants into the epitaxial layer while using the oxidized edge surfaces of the gate conducting layer as a self-aligned mask, and diffusing the implanted dopants in the epitaxial layer; and forming source regions by implanting dopants in the body region while using the oxidized edge surfaces as a self-aligned mask, and diffusing the implanted dopants in the body region, the body and source regions having an electrical short-circuit therebetween.

21. A process according to claim 20, wherein the filler layer has a thickness that is at least double a depth of the residual cavity.

22. A process according to claim 20, further comprising:

forming second trenches in the body region adjacent the gate trench, the second trenches having a depth greater than a depth of the source regions; and filling the second trenches with a conducting material for providing the electrical short-circuit between the body and source regions.

23. A process according to claim 22, wherein the second trenches are formed by anisotropic plasma etching while using the filler layer and the oxidized edge surface of the gate conducting layer as a self-aligned mask.

24. A process according to claim 20, further comprising forming a suicide layer over the gate conducting layer for increasing conductivity of the gate electrode.

25. A process according to claim 20, wherein the countersink at the upper portions of the gate trench is within a range of about 500 to 100 nm.

26. A process according to claim 20, wherein the gate dielectric layer has a thickness within a range of about 5 to 100 nm.

27. A trench gate power MOS transistor comprising:

a semiconductor substrate;

an epitaxial layer on said semiconductor substrate and having a first type of conductivity;

a body region on said epitaxial layer and having a second type of conductivity;

a gate trench extending into said body region and said epitaxial layer, with upper portions of the gate trench being countersunk;

a gate dielectric layer on surfaces of the gate trench including the upper portions thereof;

a gate conducting layer on surfaces of the gate dielectric layer for defining a gate electrode, said gate conducting layer having a thickness that is insufficient for completely filling the gate trench so that a residual cavity remains therein, with edge surfaces of said gate conducting layer being oxidized; and a filler layer in the residual cavity of the gate trench;

source regions in said body region, with said body and source regions having an electrical short-circuit therebetween.

28. A trench gate power MOS transistor according to claim 27, wherein said body region comprises a second epitaxial layer.

29. A trench gate power MOS transistor according to claim 27, further comprising:

second trenches in said body region adjacent the gate trench, and having a depth greater than a depth of said source regions; and a conducting material in the second trenches for providing the electrical short-circuit between said body and source regions.

30. A trench gate power MOS transistor according to claim 27, further comprising a layer of suicide over said gate conducting layer for increasing conductivity of the gate electrode.

31. A trench gate power MOS transistor according to claim 27, wherein the countersink at the upper portions of the gate trench is within range of about 50 to 100 nm.

32. A trench gate power MOS transistor according to claim 27, wherein said gate dielectric layer has a thickness within a range of about 5 to 100 nm.

* * * * *

UNITED STATES PATENT AND TRADEMARK OFFICE

CERTIFICATE OF CORRECTION

PATENT NO. : 6,887,760 B2
DATED : May 3, 2005
INVENTOR(S) : Curro' et al.

It is certified that error appears in the above-identified patent and that said Letters Patent is hereby corrected as shown below:

Column 8,
Lines 66 and 67, delete "suicide" insert -- silicide --.

Column 10,
Line 38, delete "suicide" insert -- silicide --.

Column 12,
Line 2, delete "suicide" insert -- silicide --.

Signed and Sealed this

Twentieth Day of September, 2005

JON W. DUDAS
*Director of the United States Patent and Trademark Office*